(12) United States Patent
Fujita et al.

(10) Patent No.: US 9,123,711 B2
(45) Date of Patent: Sep. 1, 2015

(54) WIRING MEMBER AND SEMICONDUCTOR MODULE HAVING THE SAME

(71) Applicant: DENSO CORPORATION, Kariya, Aichi-pref. (JP)

(72) Inventors: Toshihiro Fujita, Obu (JP); Hiroyasu Kidokoro, Kariya (JP); Hiromasa Hayashi, Obu (JP)

(73) Assignee: DENSO CORPORATION, Kariya (JP)

( * ) Notice: Subject to any disclaimer, the term of this patent is extended or adjusted under 35 U.S.C. 154(b) by 237 days.

(21) Appl. No.: 13/895,903

(22) Filed: May 16, 2013

(65) Prior Publication Data

US 2013/0307129 A1   Nov. 21, 2013

(30) Foreign Application Priority Data

May 17, 2012   (JP) .................................. 2012-113411

(51) Int. Cl.
*H01L 23/495* (2006.01)
*H01L 23/00* (2006.01)

(52) U.S. Cl.
CPC ...... *H01L 23/4952* (2013.01); *H01L 23/49524* (2013.01); *H01L 23/49537* (2013.01); *H01L 23/49551* (2013.01); *H01L 23/49562* (2013.01); *H01L 23/49575* (2013.01); *H01L 24/34* (2013.01); *H01L 2224/32245* (2013.01); *H01L 2224/37147* (2013.01); *H01L 2224/40137* (2013.01); *H01L 2224/40247* (2013.01); *H01L 2924/1305* (2013.01); *H01L 2924/1306* (2013.01); *H01L 2924/13055* (2013.01); *H01L 2924/13091* (2013.01)

(58) Field of Classification Search
CPC .................. H01L 23/49562; H01L 23/49575; H01L 23/49524; H01L 23/4952; H01L 23/49537; H01L 23/49541; H01L 23/49548
USPC .................................. 257/666, 669, 774, 692
See application file for complete search history.

(56) References Cited

U.S. PATENT DOCUMENTS

| | | | |
|---|---|---|---|
| 6,946,740 B2 * | 9/2005 | Schaffer ........................ | 257/777 |
| 2002/0141720 A1 * | 10/2002 | Halgren et al. ............... | 385/134 |
| 2011/0043152 A1 | 2/2011 | Kidokoro et al. | |
| 2011/0285226 A1 | 11/2011 | Fujita et al. | |

FOREIGN PATENT DOCUMENTS

| | | |
|---|---|---|
| JP | 2004-221516 | 8/2004 |
| JP | 2008-205100 | 9/2008 |

(Continued)

OTHER PUBLICATIONS

Office Action (2 pages) dated Mar. 4, 2014, issued in corresponding Japanese Application No. 2012-113411 and English translation (3 pages).

*Primary Examiner* — Roy Potter
(74) *Attorney, Agent, or Firm* — Nixon & Vanderhye PC

(57) ABSTRACT

A wiring member includes a first leg portion, a second leg portion, a third leg portion, a first connecting wall and a second connecting wall. The first leg portion is electrically connected to a first conductive portion. The second leg portion is electrically connected to a second conductive portion. The third leg portion is electrically connected to a third conductive portion. The first connecting wall connects the first leg portion and the second leg portion. The second connecting wall connects the second leg portion and the third leg portion. The first leg portion, the second leg portion, and the third leg portion are non-linearly arranged.

9 Claims, 6 Drawing Sheets

(56) References Cited

FOREIGN PATENT DOCUMENTS

| | | |
|---|---|---|
| JP | 2011-045212 | 3/2011 |
| JP | 2011-204886 | 10/2011 |
| JP | 2011-250491 | 12/2011 |
| JP | 2012-238684 | 12/2012 |

* cited by examiner

FIG. 3
FIG. 4
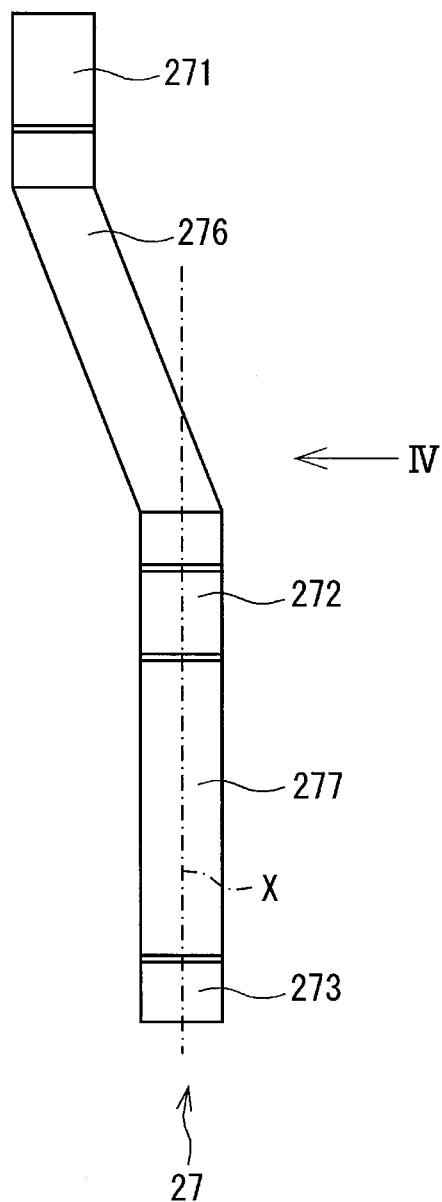
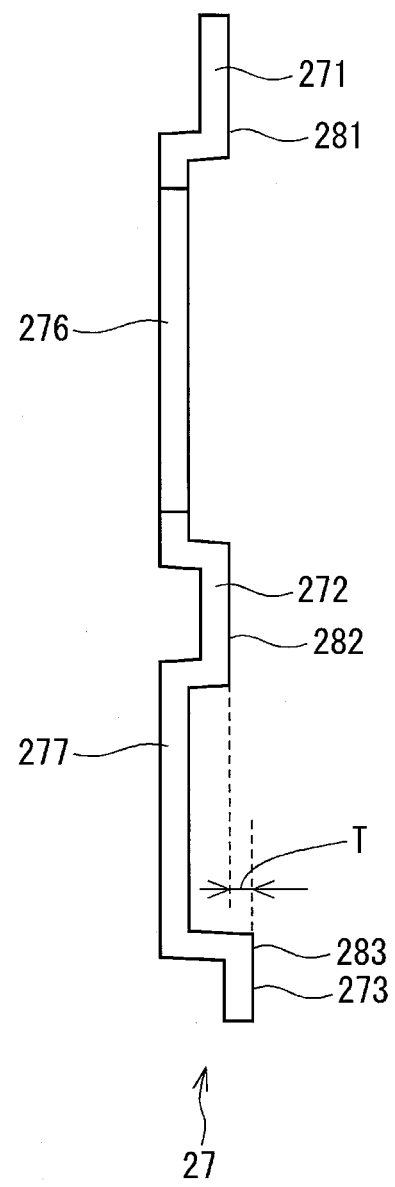

WIRING MEMBER AND SEMICONDUCTOR MODULE HAVING THE SAME

CROSS REFERENCE TO RELATED APPLICATION

This application is based on Japanese Patent Application No. 2012-113411 filed on May 17, 2012, the disclosure of which is incorporated herein by reference.

TECHNICAL FIELD

The present disclosure relates to a wiring member, and a semiconductor module having the same.

BACKGROUND

In a semiconductor module, conventionally, a semiconductor element and a lead frame are electrically coupled to each other through a wire, a clip or the like. For example, JP2011-204886A describes to couple a semiconductor element and a lead frame to each other through a copper clip.

For example, when three portions are electrically coupled using the copper clip described in JP2011-204886A, two clips are necessary. Therefore, the number of components increases. Further, the two clips are connected at four portions with a conductive adhesive such as a solder. Therefore, the area for the connection is likely to increase.

SUMMARY

It is an object of the present disclosure to provide a wiring member, which is capable of contributing to reduce the number of components and to improve a package density. It is another object of the present disclosure to provide a semiconductor module having the wiring member.

According to an aspect of the present disclosure, a wiring member includes a first leg portion, a second leg portion, a third leg portion, a first connecting wall and a second connecting wall. The first leg portion is electrically connected to a first conductive portion. The second leg portion is electrically connected to a second conductive portion. The third leg portion is electrically connected to a third conductive portion. The first connecting wall connects the first leg portion and the second leg portion. The second connecting wall connects the second leg portion and the third leg portion. Further, the first leg portion, the second leg portion and the third leg portion are non-linearly arranged.

In the configuration described above, the wiring member electrically couples the first conductive portion, the second conductive portion and the third conductive portion. In other words, the first conductive portion, the second conductive portion and the third conductive portion are electrically coupled through the wiring member, which is a single piece. Therefore, the number of components for wiring reduces. Also, the number of connecting portions reduces. In a case where the wiring member is employed to a semiconductor module, the packaging density of the semiconductor module reduces.

Further, since the first leg portion, the second leg portion and the third leg portion are non-linearly arranged, the connecting portion between the first leg portion and the first conductive portion, the connecting portion between the second leg portion and the second conductive portion, and the connecting portion between the third leg portion and the third conductive portion are located on apexes of a triangle. In such a case, even if heights of the wiring member and the conductive portions are displaced from preset heights due to a manufacturing error and the like, the wiring member is likely to tilt toward the center of the triangle provided by the three connecting portions. Therefore, the three conductive portions are properly coupled through the single wiring member. Further, since the wiring member is coupled to the conductive portions at three locations, it is less likely that the wiring member will fall down.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which:

FIG. 3 is a diagram illustrating a plan view of a clip according to the embodiment;

FIG. 4 is a diagram illustrating a side view of the clip when viewed along an arrow IV in FIG. 3;

DETAILED DESCRIPTION

Figure 1:
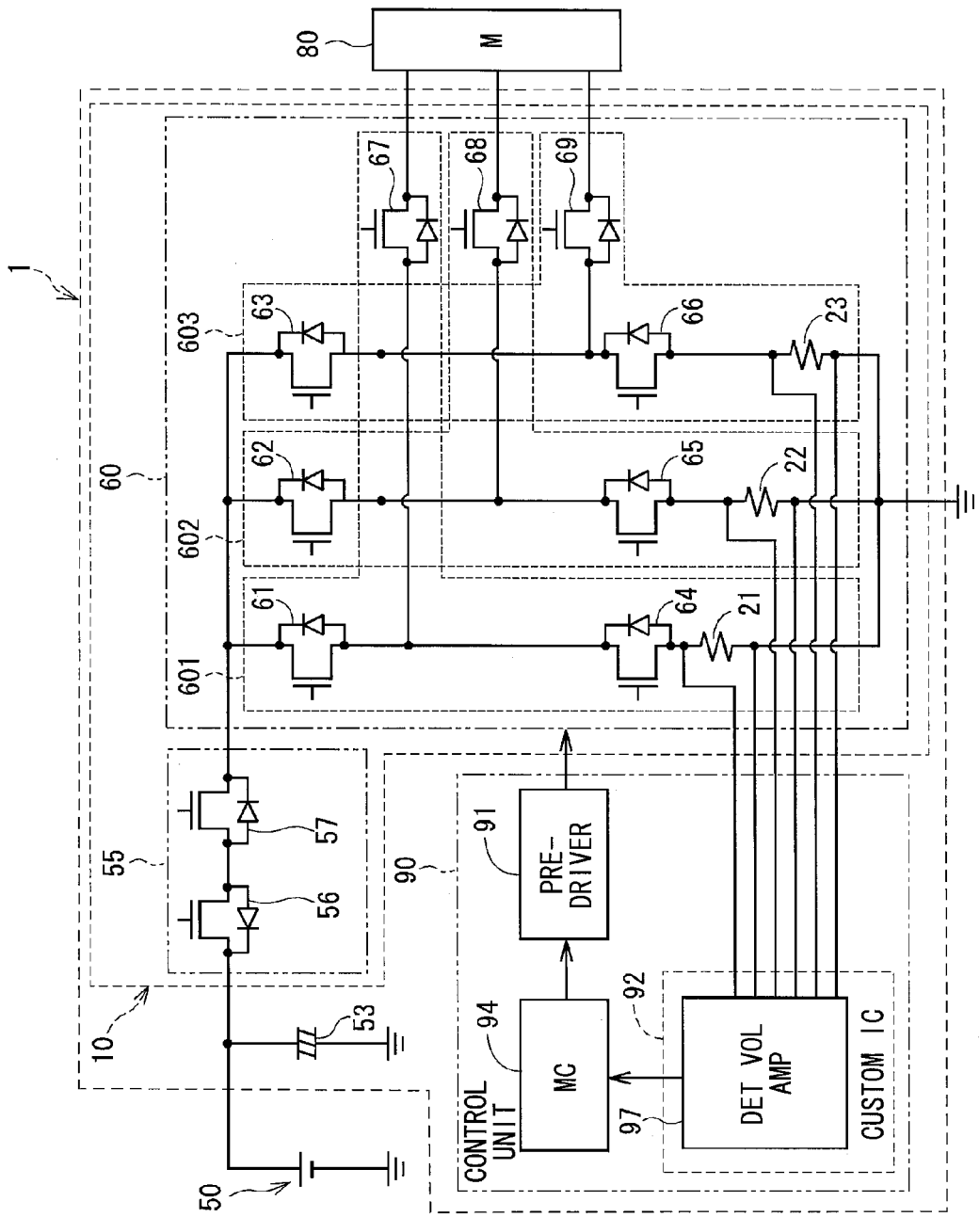
FIG. 1 is a circuit diagram illustrating a circuit structure of a semiconductor module according to an embodiment of the present disclosure.

Exemplary embodiments of a wiring member and a semiconductor module having the wiring member will be hereinafter described with reference to the drawings. Like parts will be designated with like reference numbers throughout the exemplary embodiments.

A wiring member and a semiconductor module according to an embodiment will be described with reference to FIGS. 1 to 6. In the present embodiment, the semiconductor module is employed in a motor driver, for example. Firstly, a structure of the motor driver in which the semiconductor module of the present embodiment is employed will be described with reference to FIG. 1.

The motor driver 1 includes a semiconductor module 10, a capacitor 53, and a control unit 90. The motor driver 1 converts DC power of a battery 50 as a power source into three-phase AC power, and drives a motor 80 as a load. In the present embodiment, the motor 80 is a three-phase brushless motor, for example.

The motor driver 1 includes a power source relay unit 55, and an inverter unit 60. The power source relay unit 55 includes two power source relays 56, 57. The power source relays 56, 57 are coupled in series to each other. The power source relays 56, 57 are, for example, provided by metal-oxide semiconductor field-effect transistors (MOSFET), which are a kind of field effect transistor. In the power source relays 56, 57, an electric current between the source and the drain is turned on and off according to a gate potential. By the operations of the power source relays 56, 57, the power source relay unit 55 electrically couples and decouples the battery 50 and the inverter unit 60.

The power source relay 56 is employed to shut off an electric current toward the motor 80 in a case of a malfunction such as disconnection and short-circuit. The power source relay 57 is coupled to the power source relay 56 such that a direction of a parasitic diode of the power source relay 57 is opposite to a direction of a parasitic diode of the power source relay 56. Therefore, the power source relay unit 55 restricts an electric current from flowing in a reversed direction, such as from the inverter unit 60 toward the battery 50, if the battery 50 or the capacitor 53 is erroneously connected in a reversed direction.

The inverter unit 60 includes six switching elements 61 to 66 constituting a bridge circuit. Similar to the power source relays 56, 57, the switching elements 61 to 66 are provided by metal-oxide semiconductor field-effect transistors (MOSFET), which are a kind of field-effect transistor and in which an electric current between the source and the drain is turned on and off according to a gate potential. Hereinafter, the switching elements 61 to 66 will be also referred to as FETs 61 to 66.

The FETs 61, 62, 63 are disposed in a higher potential side of the bridge circuit and provide an upper arm of the bridge circuit. The FETs 64, 65, 66 are disposed in a lower potential side of the bridge circuit and provide a lower arm of the bridge circuit. Hereinafter, the FETs 61, 62, 63 will be also referred to as upper arm FETs, and the FETs 64, 65, 66 will be also referred to as lower arm FETs.

The inverter unit 60 includes motor relays 67, 68, 69 as load relays. The motor relays 67, 68, 69 are provided for phases of the motor 80, respectively. Each of the motor relays 67, 68, 69 is disposed between a coupling point of the upper arm FET 61, 62, 63 and the lower arm FET 64, 65, 66, which are in the corresponding phase, and a winding of the motor 80 in the corresponding phase. Each of the motor relays 67, 68, 69 shuts off an electric current toward the motor 80 in a case of a malfunction such as disconnection and short-circuit.

Similar to the power source relays 56, 57, 58 and the FETs 61 to 66, the motor relays 67, 68, 69 are provided by metal-oxide semiconductor field-effect transistors (MOSFET), which are a kind of field-effect transistor and in which an electric current between the source and the drain is turned on and off according to a gate potential.

The upper arm FET 61, the lower arm FET 64 and the motor relay 67 provide a U-phase circuit 601. The upper arm FET 62, the lower arm FET 65 and the motor relay 68 provide a V-phase circuit 602. The upper arm FET 63, the lower arm FET 66 and the motor relay 69 provide a W-phase circuit 603.

In regard to the U-phase circuit 601, the drain of the FET 61 is coupled to a high-potential line that is coupled to a high-potential electrode of the battery 50, and the source of the FET 61 is coupled to the drain of the FET 64. The source of the FET 64 is grounded through a shunt resistor 21. The coupling point between the FET 61 and the FET 64 is coupled to a U-phase winding of the motor 80 through the motor relay 67.

In regard to the V-phase circuit 602, the drain of the FET 62 is coupled to the high-potential line that is coupled to the high-potential electrode of the battery 50, and the source of the FET 62 is coupled to the drain of the FET 65. The source of the FET 65 is grounded through a shunt resistor 22. The coupling point between the FET 62 and the FET 65 is coupled to a V-phase winding of the motor 80 through the motor relay 68.

In regard to the W-phase circuit 603, the drain of the FET 63 is coupled to the high-potential line that is coupled to the high-potential electrode of the battery 50, and the source of the FET 63 is coupled to the drain of the FET 66. The source of the FET 66 is grounded through a shunt resistor 23. The coupling point between the FET 63 and the FET 66 is coupled to a W-phase winding of the motor 80 through the motor relay 69.

Each of the shunt resistors 21, 22, 23 detects an electric current supplied to the corresponding phase of the motor 80. In particular, the shunt resistor 21 detects an electric current supplied to the U-phase winding. The shunt resistor 22 detects an electric current supplied to the V-phase winding. The shunt resistor 23 detects an electric current supplied to the W-phase winding.

The capacitor 53 is disposed between the high-potential electrode of the battery 50 and the inverter unit 60. The capacitor 53 reduces noise transmitted from other devices, which share the battery 50 with the motor driver 1. The capacitor 53 also reduces noise from being transmitted from the motor driver 1 to the other devices, which share the battery 50 with the motor driver 1. The capacitor 53 is, for example, provided by an aluminum electrolytic capacitor.

The control unit 90 includes a pre-driver 91, a custom IC 92, and a microcomputer (MC) 94. The custom IC 92 includes a detection voltage amplifying part (DET VOL AMP) 97 and the like as a function block. The detection voltage amplifying part 97 detects voltages at both ends of each of the shunt resistors 21, 22, 23, and amplifies the voltages. Further, the detection voltage amplifying part 97 outputs the voltages amplified to the microcomputer 94.

The microcomputer 94 detects the electric current supplied to the motor 80 based on the voltages of both the ends of the shunt resistors 21, 22, 23, which are outputted from the detection voltage amplifying part 97. The microcomputer 94 receives signals, such as a signal indicative of an angle of rotation of the motor 80. The microcomputer 94 drives the predriver 91 based on the signals received, thereby to control the inverter unit 60.

In particular, an output terminal of the predriver 91 is coupled to the gate of each of the FETs 61 to 66. The predriver 91 changes a gate voltage applied to the gate of the FET 61 to 66 to turn on and off the FET 61 to 66. Likewise, the microcomputer 94 changes the gate voltage applied to each of the power source relays 56, 57 and the motor relays 67, 68, 69 to turn on and off the relays 56, 57, 67, 68, 69.

In the present embodiment, the power source relay unit 55 and the inverter unit 60 are integrated into one semiconductor module 10. A structure of the semiconductor module 10 will be described with reference to FIG. 2.

Figure 2:
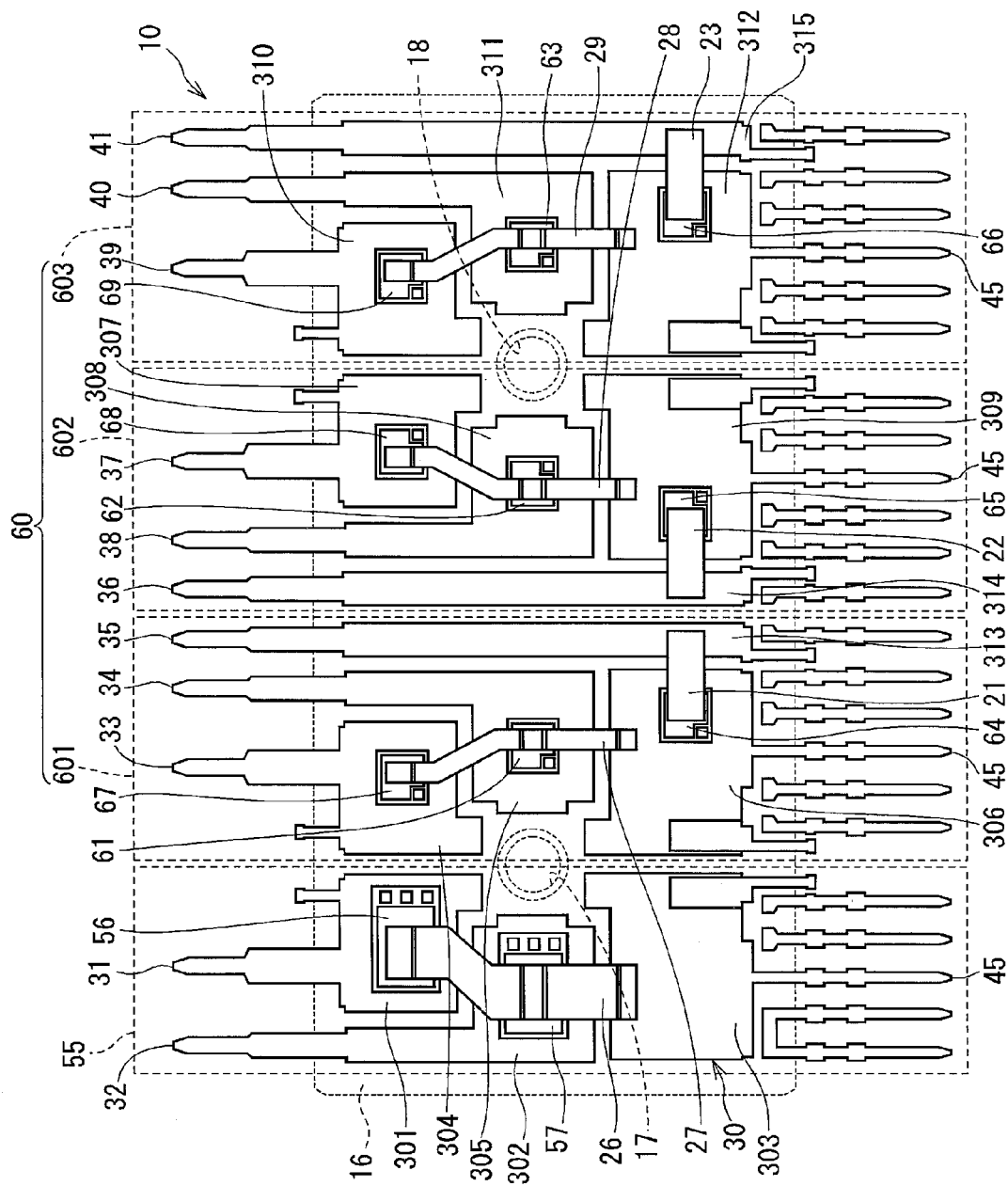
FIG. 2 is a diagram illustrating a plan view of an internal structure of the semiconductor module according to the embodiment.

As shown in FIG. 2, the semiconductor module 10 includes a lead frame 30 made of a copper plate and a molded part 16 encapsulating the lead frame 30. The semiconductor module 10 has a generally flat plate shape as a whole. The molded part 16 is formed with holes 17, 18. For example, the semiconductor module 10 is fixed to another member, such as a heat sink, by fixing members, such as screws, inserted into the holes 17, 18.

The lead frame 30 has power terminals 31 to 41, control terminals 45 and lands 301 to 315. The power terminals 31 to 41 project from one of lengthwise sides of the molded part 16 (e.g., upper side in FIG. 2). The control terminals 45 project from the other lengthwise side of the molded part 16 (e.g., lower side in FIG. 2). The widths of the power terminals 31 to 41 are relatively large, and are, for example, greater than those of the control terminals 45. The power terminals 31 to 41 are electrically coupled to the windings of the motor 80, the battery 50 and the like. The control terminals 45 are coupled to a control substrate (not shown).

The power source relay 56 of the power source relay unit 55 is mounted on the land 301. The land 301 is integral with the power terminal 31 that is coupled to the high-potential electrode of the battery 50. The power source relay 56 is mounted on the land 301 such that the drain is adjacent to the land 301 and the source is disposed on an upper surface opposite to the land 301. The drain of the power source relay 56 is connected to the land 301.

Each of the power source relay 57, the FETs 61 to 66 and the motor relays 67, 68, 69 is mounted on a corresponding land such that the source and the drain are arranged to the corresponding land, in the similar manner to the power source relay 56.

The power source relay 57 is mounted on the land 302. The land 302 is integral with the power terminals 32 that is coupled to the inverter unit 60.

The source of the power source relay 56, the source of the power source relay 57 and the land 303 that is integral with the control terminal 45 are coupled through a clip 26. The structure of the clip 26 will be described later in detail.

In regard to the U-phase circuit 601 of the inverter unit 60, the FET 61 is mounted on the land 305. The land 305 is integral with the power terminal 34 that is coupled to the high-potential electrode of the battery 50. The FET 64 is mounted on the land 306 that is integral with the control terminal 45. The motor relay 67 is mounted on the land 304. The land 304 is integral with the power terminal 33 that is coupled to the U-phase winding of the motor 80. The source of the motor relay 67, the source of the FET 61 and the land 306 that is connected to the drain of the FET 64 are coupled through a clip 27. The source of the FET 64 is coupled to the land 313 through the shunt resistor 21. The land 313 is integral with the power terminal 35 that is coupled to the ground.

In regard to the V-phase circuit 602, the FET 62 is mounted on the land 308. The land 308 is integral with the power terminal 38 that is coupled to the high-potential electrode of the battery 50. The FET 65 is mounted on the land 309 that is integral with the control terminal 45. The motor relay 68 is mounted on the land 307. The land 307 is integral with the power terminal 37 that is coupled to the V-phase winding of the motor 80. The source of the motor relay 68, the source of the FET 62, and the land 309 to which the drain of the FET 65 is connected are coupled through a clip 28. The source of the FET 65 is coupled to the land 314 through the shunt resistor 22. The land 314 is integral with the power terminal 36 that is coupled to the ground.

In regard to the W-phase circuit 603, the FET 63 is mounted on the land 311. The land 311 is integral with the power terminal 40 that is coupled to the high-potential electrode of the battery 50. The FET 66 is mounted on the land 312 that is integral with the control terminal 45. The motor relay 69 is mounted on the land 310. The land 310 is integral with the power terminal 39 that is coupled to the W-phase winding of the motor 80. The source of the motor relay 69, the source of the FET 63, and the land 312 to which the drain of the FET 66 is connected are coupled through a clip 29. The source of the FET 66 is coupled to the land 315 through the shunt resistor 23. The land 315 is integral with the power terminal 41 that is coupled to the ground.

In the present embodiment, the clips 26 to 29 are used as wiring members (coupling members) for electrically coupling components in the semiconductor module 10.

The clips 26 to 29 are made of a conductive material such as copper. The clip 26 to 29 may be plated in view of improving mountability or durability. In the present embodiment, for example, each of the clips 26 to 29 is made by pressing a flat copper plate. When the electrical coupling is provided by using the plate-like clips 26 to 29 having a relatively large cross-sectional area, in place of bonding wires, the interconnection resistance can be reduced.

In the present embodiment, the power source relays 56, 57 are provided by the MOSFETs that are larger than the FETs 61 to 66 and the motor relays 67, 68, 69. Therefore, the width of the clip 26 is greater than that of the clips 27 to 29 according to the size of the corresponding MOSFET so as to reduce the interconnection resistance.

Figure 5:
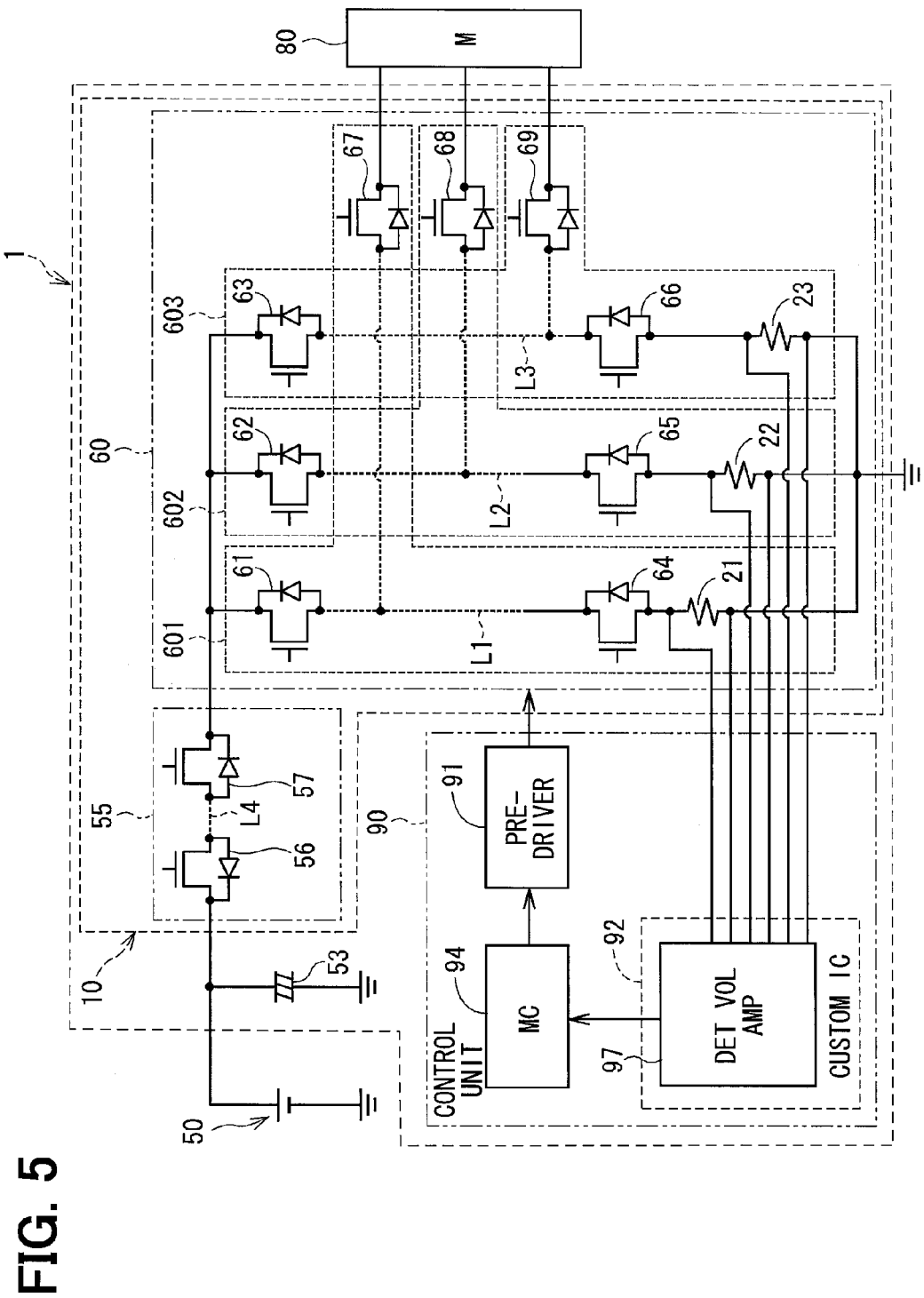
FIG. 5 is a circuit diagram for illustrating a circuit structure provided by the clip in the semiconductor module according to the embodiment.

In the circuit of the semiconductor module 10, the clips 26 to 29 provide wiring portions/electrical connecting portions as shown by dashed lines in FIG. 5. In particular, the clip 27 provides a wiring portion shown by a dashed line L1, the clip 28 provides a wiring portion shown by a dashed line L2, and the clip 29 provides a wiring portion shown by a dashed line L3. Also, the clip 26 provides a wiring portion shown by a dashed line L4.

The clips 26 to 29 have the substantially similar shape. Therefore, the clip 27 will be hereinafter described in detail with reference to FIGS. 3 and 4, as an example.

Referring to FIGS. 3 and 4, the clip 27 includes a first leg portion 271, a second leg portion 272, a third leg portion 273, a first connecting wall 276 and a second connecting wall 277. The first leg portion 271 is located at a first end of the clip 27 with respect to a longitudinal direction of the clip 27 (e.g., an up and down direction in FIGS. 3 and 4). The third leg portion 273 is located at a second end of the clip 27 opposite to the first end with respect to the longitudinal direction of the clip 27. The second leg portion 272 is located between the first end and the second end, such as at a substantially middle position of the clip 27.

The clip 27 is arranged such that a first bottom surface 281 of the first leg portion 271, a second bottom surface 282 of the second leg portion 272 and a third bottom surface 283 of the third leg portion 273 face toward the lead frame 30. The bottom surfaces 281, 282, 283 are electrically connected to respective portions through solder 290 (e.g., FIG. 7B) or the like. In particular, the first bottom surface 281 is connected to the source of the motor relay 67. The second bottom surface 282 is connected to the source of the FET 61. The third bottom surface 283 is connected to the land 306. Namely, the clip 27 has the three leg portions 271, 272, 273 to provide three connecting portions. When the clip 27 is used, three portions can be electrically connected through the clip 27, which is a single piece.

The first bottom surface 281 and the second bottom surface 282 are offset from the third bottom surface 283 by the thickness T of the motor relay 67 and the FET 61 in a direction away from the lead frame 30. In other words, the first bottom surface 281 and the second bottom surface 282 are at a height different from the third bottom surface 283.

The first connecting wall 276 and the second connecting wall 277 are located opposite to the first, second and third bottom surfaces 281, 282, 283. In other words, when the clip 27 is mounted on the lead frame 30, the first connecting wall 276 and the second connecting wall 277 are located at positions higher than the first, second third leg portions 271, 272, 273 with respect to a direction perpendicular to a surface (e.g., imaginary plane) including the land 306.

As shown in FIG. 3, the second leg portion 272, the second connecting wall 277 and the third leg portion 273 are located on a straight line X. The first leg portion 271 is offset from the straight line X on which the second leg portion 272, the second connecting wall 277 and the third leg portion 273 are located. That is, the first leg portion 271 is not located on the straight line X. In other words, the first leg portion 271, the second leg portion 272 and the third leg portion 273 are not arranged on the straight line X. Namely, the first leg portion 271, the second leg portion 272 and the third leg portion 273 are non-linearly arranged. Thus, a first connecting point between the first leg portion 271 and the motor relay 67, a second connecting point between the second leg portion 272 and the FET 61, and a third connecting point between the third leg portion 273 and the land 306 form a triangle shape. That is, the first connecting point, the second connecting point and the third connecting point are not arranged on a straight line, but are located on the apexes of a triangle.

Figure 6A:
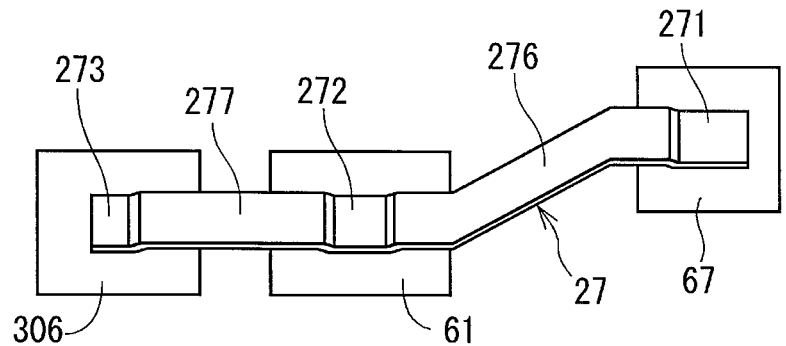
FIG. 6A is an explanatory diagram illustrating a plan view of the clip, in a case where a manufacturing error is generated, according to the embodiment.
Figure 6B:
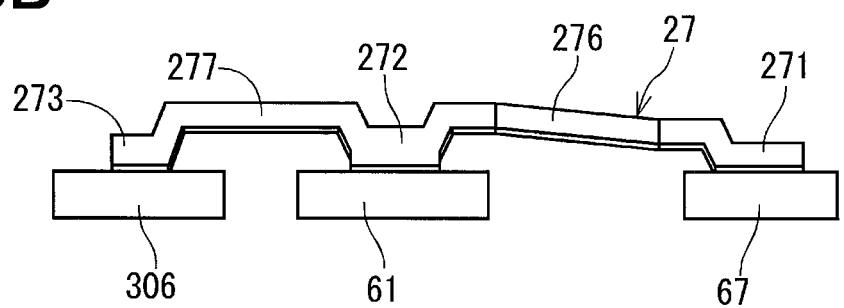
FIG. 6B is an explanatory diagram illustrating a side view of the clip, in the case where the manufacturing error is generated, according to the embodiment.
Figure 6C:
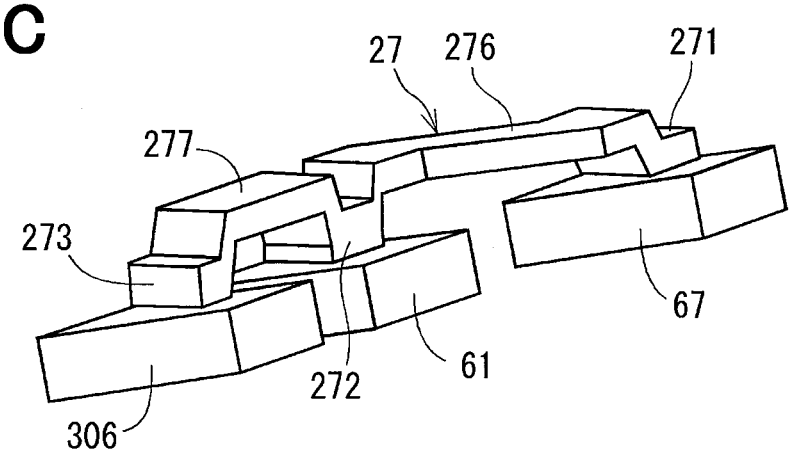
FIG. 6C is an explanatory diagram illustrating a perspective view of the clip, in the case where the manufacturing error is generated, according to the embodiment.

The advantageous effects achieved by the clip 27 having the above-described configuration will be hereinafter described with reference to FIGS. 6A, 6B, 6C, 7A and 7B. In FIGS. 6A, 6B, 6C and 7A, the motor relay 67, the FET 61 and the land 306 are illustrated as being at the same height, that is, on the same plane. However, in the actual configuration, the motor relay 67 and the FET 61 are higher than the land 306 by the thickness of the MOSFET. In FIGS. 6B and 6C, the solder 290 is not illustrated for the sake of simplicity.

The clip 27 is made by pressing. Therefore, the heights of the first leg portion 271, the second leg portion 272 and the third leg portion 273 may be displaced from their preset heights due to the manufacturing error or the like in the pressing. Also, the heights of the lands 301 to 315 may be displaced from their preset heights when the wiring patterns are formed.

Figure 7A:
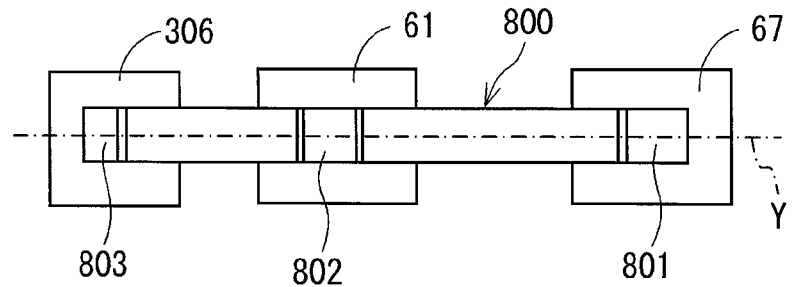
FIG. 7A is an explanatory diagram illustrating a plan view of a clip as a comparative example to the embodiment, in a case where a manufacturing error is generated.
Figure 7B:
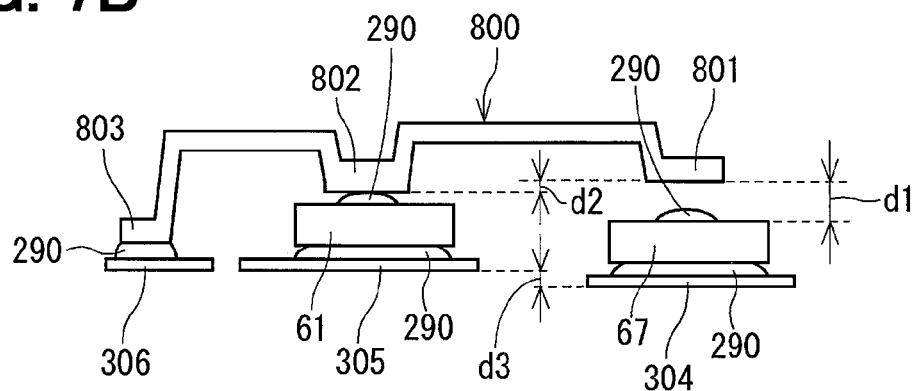
FIG. 7B is an explanatory diagram illustrating a side view of the clip as the comparative example, in the case where the manufacturing error is generated.

FIGS. 7A and 7B are diagrams illustrating a clip 800 as a comparative example to the clip 27 of the present embodiment. As shown in FIGS. 7A and 7B, the clip 800 has a first leg portion 801, a second leg portion 802 and a third leg portion 803. The first leg portion 801, the second leg portion 802 and the third leg portion 803 are arranged on a straight line Y.

FIG. 7B illustrates a case where the first leg portion 801 is displaced by a distance d2 in a direction away from the motor relay 67 due to the manufacturing error or the like, and the land 304 is displaced by a distance d3 in a direction away from the first leg portion 801 due to the manufacturing error or the like. In such a case, due to the accumulation of the errors, a gap d1 is generated between the first leg portion 801 and the motor relay 67. The dimension of the gap d1 corresponds to the sum of the distance d2 and the distance d3.

In this case, since the first leg portion 801, the second leg portion 802 and the third leg portion 803 are arranged on the straight line Y, the first leg portion 801 and the motor relay 67 cannot be connected to each other. In particular, in a case where the first leg portion 801, the second leg portion 802 and the third leg portion 803 are designed at different heights, the accumulation of the manufacturing errors as shown in FIG. 7B will occur.

In the present embodiment, on the other hand, the first leg portion 271, the second leg portion 272 and the third leg portion 273 are non-linearly arranged. In other words, the center of the first leg portion 271, the center of the second leg portion 272 and the center of the third leg portion 273 are not arranged on the straight line X, and at least one of the centers is offset from the straight line X. Therefore, as shown in FIG. 6C, the clip 27 is tilted toward the center of the triangle provided by the first connecting point between the first leg portion 271 and the motor relay 67, the second connecting point between the second leg portion 272 and the FET 61, and the third connecting point between the third leg portion 273 and the land 306. Therefore, it is less likely that a gap will be generated in each of the connecting portions. Accordingly, the clip 27 can properly couple the motor relay 67, the FET 61 and the land 306.

The clip 27 has the three connecting portions that are non-linearly arranged, and the three connecting portions form the triangle. Therefore, the balance of the clip 27 improves. As such, it is less likely that the clip 27 will be fall down during a manufacturing process, such as during reflowing. In particular, a clip having a small width will easily fall down during the manufacturing process, such as during reflowing. In the present embodiment, since the first leg portion 271, the second leg portion 272 and the third leg portion 273 are non-linearly arranged, the clip 27 will not fall down. In other words, the balance of the clip 27 improves since the first leg portion 271, the second leg portion 272 and the third leg portion 273 are non-linearly arranged. Therefore, the width of the clip 27 can be reduced, and hence the mounting area of the clip 27 can be reduced. The similar advantageous effects will be achieved also in the clips 26, 28, 29.

As described above, the clip 27 includes the first leg portion 271, the second leg portion 272, the third leg portion 273, the first connecting wall 276 and the second connecting wall 277. The first leg portion 271 is electrically connected to the motor relay 67. The second leg portion 272 is electrically connected to the FET 61. The third leg portion 273 is electrically connected to the land 306. The first connecting wall 276 connects the first leg portion 271 and the second leg portion 272. The second connecting wall 277 connects the second leg portion 272 and the third leg portion 273. Further, the first leg portion 271, the second leg portion 272 and the third leg portion 273 are non-linearly arranged.

In the present embodiment, since the motor relay 67, the FET 61, and the land 306 are electrically coupled through the single clip 27, the number of components reduces. As compared with a case where three components are connected using two clips, the number of connecting portions reduces. Therefore, the package density of the semiconductor module 10 can be increased.

Since the first leg portion 271, the second leg portion 272 and the third leg portion 273 are non-linearly arranged, the first connecting portion between the first leg portion 271 and the motor relay 67, the second connecting portion between the second leg portion 272 and the FET 61 and the third connecting portion between the third leg portion 273 and the land 306 are located at the apexes of the triangle. Therefore, even if the heights of the clip 27, the motor relay 67, the FET 61 and the land 306 are displaced from their preset heights due to the manufacturing errors or the like, since the clip 27 is tilted toward the center of the triangle defined by the first to third connecting portions, the clip 27 is properly connected at the three connecting portions. Since the clip 27 has the three connecting portions, the balance of the clip 27 improves. As such, it is less likely that the clip 27 will fall down.

The semiconductor module 10 includes the clips 26 to 29, the power source relays 56, 57, the FETs 61 to 66, and the motor relays 67, 68, 69. The power source relays 56, 57, the FETs 61 to 66 and the motor relays 67, 68, 69 are mounted on the lead frame 30.

In the first embodiment, the first leg portion 271 is connected to the source of the motor relay 67 as a first conductive portion. The motor relay 67 is disposed between the coupling point between the upper arm and the lower arm of the bridge circuit and the motor 80, and has the source on its upper surface. The second leg portion 272 is connected to the source of the FET 61 as a second conductive portion. The FET 61 constitutes the upper arm of the bridge circuit, and has the source on its upper surface. The third leg portion 273 is connected to the land 306 of the lead frame 30 as a third conductive portion. The land 306 is connected to the drain of the lower arm FET 64. The land 306 as the third conductive portion is located at the different height from the motor relay 67 as the first conductive portion and the FET 61 as the second conductive portion.

Likewise, the first leg portion of the clip 26 is connected to the source of the power source relay 56 as the first conductive portion. The power source relay 56 is disposed between the bridge circuit and the battery 50, and has the source on its upper surface. The second leg portion of the clip 26 is connected to the source of the power source relay 57 as the second conductive portion. The power source relay 57 is disposed between the bride circuit and the battery 50, and has the source on its upper surface. The third leg portion of the clip 26 is connected to the land 303 as the third conductive portion. The land 303 as the third conductive portion is at the different height from the power source relay 56 as the first conductive portion and the power source relay 57 as the second conductive portion.

As described above, in a case where the first conductive portion, the second conductive portion and the third conductive portion are to be arranged at the different heights, even if the heights of the leg portions of the clips 26, 27 or the conductive portions are varied from their preset heights due to the manufacturing error or the like, the three conductive portions are properly connected to each other through the single clip 26, 27. The clip 28, 29 will also achieve the similar advantageous effects.

In the present embodiment, the clips 26 to 29 correspond to wiring members. The power source relay 56 and the motor relays 67, 68, 69 provide the first conductive portions connected to the first leg portions. The power source relay 57 and the FETs 61, 62, 63 provide the second conductive portions connected to the second leg portions. The lands 303, 306, 309, 312 provide the third conductive portions connected to the third leg portions. In the semiconductor module 10, the power source relays 56, 57, the FETs 61 to 66 and the motor relays 67, 68, 69 correspond to semiconductor elements. Further, the FETs 61 to 66 correspond to switching elements, and the motor relays 67, 68, 69 correspond to load relays. Moreover, the motor 80 corresponds to a load. The battery 50 corresponds to a power source.

Figure 8:
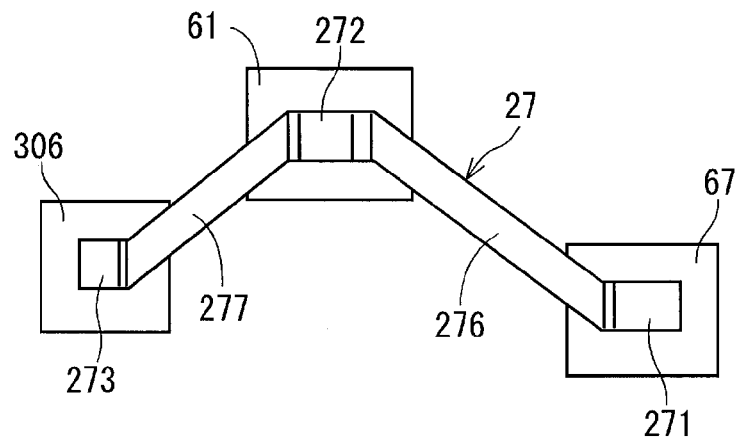
FIG. 8 is a diagram illustrating a plan view of a clip according to another embodiment of the present disclosure.

Other Embodiments (1) In the embodiment described above, the first leg portion, the first connecting wall and the second leg portion of the wiring member are located on the straight line X. As a modification, the wiring member may have any other shape as long as the first leg portion, the second leg portion and the third leg portion are non-linearly arranged. For example, as shown in FIG. 8, the first connecting wall 276 and the second connecting wall 277 may be tilted with respect to a longitudinal direction of the wiring member. In this case, the longitudinal direction of the wiring member corresponds to the right and left direction in FIG. 8. Also in the wiring member shown in FIG. 8, the advantageous effects similar to the above described embodiment will be achieved.

(2) In the embodiment described above, the first leg portion and the second leg portion are connected to the semiconductor elements, and the third leg portion is connected to the land of the lead frame. As a modification, any of the first leg portion, the second leg portion and the third leg portion may be connected to the semiconductor element. As another modification, all the first leg portion, the second leg portion and the third leg portion may be connected to the semiconductor elements. As further another modification, any of the first leg portion, the second leg portion and the third leg portion may be connected to the lead frame. As still another modification, all the first leg portion, the second leg portion and the third leg portion may be connected to the lead frame.

Further, the first leg portion, the second leg portion and the third leg portion may be arranged at the same height, and the first connecting portion between the first leg portion and the first conductive portion, the second connecting portion between the second leg portion and the second conductive portion, and the third connecting portion between the third leg portion and the third conductive portion may be at the same height. As further modification, all the first leg portion, the second leg portion and the third leg portion may be at different heights.

(3) In the embodiment described above, the clip as the wiring member connects between the semiconductor element and the lead frame. As a modification, the clip may be used to connect any other components, such as a substrate in place of the lead frame, and electronic components other than the semiconductor elements.

In the embodiment described above, the semiconductor element is provided by the MOSFET. However, the semiconductor element may be any other devices, such as an insulated gate bipolar transistor (IGBT). When the semiconductor element is the IGBT, the first conductive portion or the second conductive portion may be provided by an emitter of the IGBT, and the third conductive portion may be provided a lead frame connected to a collector.

(4) In the embodiment described above, the clip is made by pressing. However, the clip may be made by any other method.

(5) In the embodiment described above, four clips 26 to 29 as the wiring members are used in the single semiconductor module 10. As a modification, the semiconductor module 10 may not be limited to a specific one and may have any other configuration, as long as at least one wiring member is used. The wiring member described above may be used for any devices, other than the semiconductor module.

(6) In the embodiment described above, the semiconductor module is employed in the motor driver. However, the semiconductor module may be used to any other devices.

(7) The configuration of each phase circuit of the inverter unit, the arrangement of the power source relay unit, the layout of the lead frame are not limited to the above, but may be modified in various other ways.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A wiring member comprising:
   a first leg portion being electrically connected to a first conductive portion;
   a second leg portion being electrically connected to a second conductive portion;
   a third leg portion being electrically connected to a third conductive portion;
   a first connecting wall connecting the first leg portion and the second leg portion; and
   a second connecting wall connecting the second leg portion and the third leg portion, wherein
   the first leg portion, the second leg portion and the third leg portion are non-linearly arranged; and
   the first leg portion, the second leg portion, the third leg portion, the first connecting wall and the second connecting wall are provided by a single piece that is made of a conductive material.

2. The wiring member according to claim 1, wherein
   the first leg portion defines a first connecting portion with the first conductive portion,
   the second leg portion defines a second connecting portion with the second conductive portion,
   the third leg portion defines a third connecting portion with the third conductive portion, and
   at least one of the first connecting portion, the second connecting portion and the third connecting portion is at a height different from the other.

3. A semiconductor module comprising:
   the wiring member according to claim 1;
   a lead frame; and
   a first semiconductor element and a second semiconductor element disposed on the lead frame, wherein
   the first conductive portion is provided by the first semiconductor element,
   the second conductive portion is provided by the second semiconductor element, and
   the third conductive portion is provided by the lead frame.

4. The semiconductor module according to claim 3, wherein
   the first semiconductor element is one of an upper arm switching element that constitutes an upper arm of a bridge circuit, a lower arm switching element that constitutes a lower arm of the bridge circuit, and a load relay that is disposed between a load and a coupling point between the upper arm and the lower arm, and
   the second semiconductor element is another one of the upper arm switching element, the lower arm switching element, and the load relay.

5. The semiconductor module according to claim 4, wherein
   the first conductive portion is provided by a source of the load relay,
   the second conductive portion is provided by a source of the upper arm switching element, and
   the lead frame, which provides the third conductive portion, is connected to a drain of the lower arm switching element.

6. The semiconductor module according to claim 3, wherein at least one of the first semiconductor element and the second semiconductor element is a power source relay that is disposed between a bridge circuit and a power source.

7. The semiconductor module according to claim 3, wherein
   the first semiconductor element is a first power source relay that is disposed between a bridge circuit and a power source, and the first conductive portion is provided by a source of the first power source relay, and
   the second semiconductor element is a second power source relay that is disposed between the bridge circuit and the power source, and the second conductive portion is provided by a source of the second power source relay.

8. A wiring member comprising:
   a first leg portion being electrically connected to a first conductive portion;
   a second leg portion being electrically connected to a second conductive portion;
   a third leg portion being electrically connected to a third conductive portion;
   a first connecting wall connecting the first leg portion and the second leg portion; and
   a second connecting wall connecting the second leg portion and the third leg portion, wherein
   the first leg portion, the second leg portion and the third leg portion are non-linearly arranged;
   the first leg portion defines a first connecting portion with the first conductive portion,
   the second leg portion defines a second connecting portion with the second conductive portion,
   the third leg portion defines a third connecting portion with the third conductive portion, and
   at least one of the first connecting portion, the second connecting portion and the third connecting portion is at a height different from the other.

9. A semiconductor module comprising:
   a wiring member wiring member comprising:
      a first leg portion being electrically connected to a first conductive portion;
      a second leg portion being electrically connected to a second conductive portion;
      a third leg portion being electrically connected to a third conductive portion;
      a first connecting wall connecting the first leg portion and the second leg portion; and
      a second connecting wall connecting the second leg portion and the third leg portion;
      wherein the first leg portion, the second leg portion and the third leg portion are non-linearly arranged;
   a lead frame; and
   a first semiconductor element and a second semiconductor element disposed on the lead frame, wherein
   the first conductive portion is provided by the first semiconductor element,
   the second conductive portion is provided by the second semiconductor element, and
   the third conductive portion is provided by the lead frame.

* * * * *